US008728714B2

(12) United States Patent
Millward

(10) Patent No.: US 8,728,714 B2
(45) Date of Patent: May 20, 2014

(54) METHODS FOR ADHERING MATERIALS, FOR ENHANCING ADHESION BETWEEN MATERIALS, AND FOR PATTERNING MATERIALS, AND RELATED SEMICONDUCTOR DEVICE STRUCTURES

(75) Inventor: Dan B. Millward, Boise, ID (US)

(73) Assignee: Micron Technology, Inc., Boise, ID (US)

(*) Notice: Subject to any disclaimer, the term of this patent is extended or adjusted under 35 U.S.C. 154(b) by 155 days.

(21) Appl. No.: 13/298,889

(22) Filed: Nov. 17, 2011

(65) Prior Publication Data
US 2013/0127021 A1    May 23, 2013

(51) Int. Cl.
*G01N 33/557*    (2006.01)

(52) U.S. Cl.
USPC ............ 430/313; 257/E21.247; 438/694

(58) Field of Classification Search
USPC ............ 257/E21.247; 424/423; 430/5, 313, 430/330; 438/694
See application file for complete search history.

(56) References Cited

U.S. PATENT DOCUMENTS

| | | | |
|---|---|---|---|
| 6,361,921 B1 | 3/2002 | Thompson | |
| 7,252,862 B2 | 8/2007 | Jung et al. | |
| 7,514,764 B2 | 4/2009 | Nealey et al. | |
| 7,851,252 B2 | 12/2010 | Nealey et al. | |
| 2003/0027087 A1* | 2/2003 | Lederer | 430/330 |
| 2003/0219603 A1* | 11/2003 | Teng et al. | 428/414 |
| 2008/0076255 A1* | 3/2008 | Hata et al. | 438/694 |
| 2008/0193658 A1 | 8/2008 | Millward | |
| 2009/0155335 A1* | 6/2009 | O'Shaughnessey et al. | 424/423 |
| 2010/0294740 A1 | 11/2010 | Cheng et al. | |
| 2011/0065597 A1* | 3/2011 | Williams et al. | 506/9 |
| 2011/0147984 A1 | 6/2011 | Cheng et al. | |

FOREIGN PATENT DOCUMENTS

WO    2008097736 A2    8/2008

OTHER PUBLICATIONS

Mansky et al., Controlling Polymer-Surface Interactions with Random Copolymer Brushes, Science, vol. 275, Mar. 7, 1997, pp. 1458-1460.
Padeste et al., Patterned Grafting of Polymer Brushes onto Flexible Polymer Substrates, J. Vac. Sci. Technol., vol. B 22, No. 6, Nov./Dec. 2004, pp. 3191-3195.
Shahid et al., Polymer Brushes, http://www.slideshare.net/anihilator01/polymer-brushes, last visited Sep. 13, 2011.

* cited by examiner

*Primary Examiner* — Thomas L Dickey
(74) *Attorney, Agent, or Firm* — TraskBritt

(57) ABSTRACT

Methods for adhering materials and methods for enhancing adhesion between materials are disclosed. In some embodiments, a polymer brush material is bonded to a base material, and a developable polymer resist material is applied over the grafted polymer brush material. The resist material is at least partially miscible in the grafted polymer brush material. As such, the resist material at least partially dissolves within the grafted polymer brush material to form an intertwined material of grafted polymer brush macromolecules and resist polymer macromolecules. Adhesion between the developable polymer resist and the base material may be thereby enhanced. Also disclosed are related semiconductor device structures.

25 Claims, 7 Drawing Sheets

METHODS FOR ADHERING MATERIALS, FOR ENHANCING ADHESION BETWEEN MATERIALS, AND FOR PATTERNING MATERIALS, AND RELATED SEMICONDUCTOR DEVICE STRUCTURES

FIELD

The present disclosure, in various embodiments, relates generally to semiconductor device design and fabrication. More particularly, this disclosure relates to semiconductor fabrication methods involving polymer brushes, lithography processes, or polymer-based materials deposited over a base material, and to semiconductor device structures associated with such methods.

BACKGROUND

Photolithographic patterning is a well-established technology in the manufacturing processes of various integrated circuits (IC's), including IC's with semiconductor devices, and liquid crystal display panels. During photolithographic patterning, a photosensitive resist, such as a developable polymer material, is coated onto a surface of a base material, which may be a substrate or a material supported by the substrate, to deposit a photoresist material, also referred to in the industry and herein as a "resist material." Before application of the resist material, the surface of the base material may first be coated with a primer, such as hexamethyldisilazane (HMDS), to promote adhesion between the resist material and an otherwise hydrophilic base material surface. When the resist material is applied, the resist material adheres to the primer on the base material through polar and Van der Waals forces. While application of the primer increases adhesion between the resist material and the base material, the primer does not increase surface area interactions between the resist material and the base material.

The resist material is then selectively masked and exposed to an energy source (e.g., radiation, such as ultraviolet light or an electron beam), so that select segments of the resist material are exposed while other masked segments of the resist material are not exposed. Subsequently, the resist material is subjected to a developer, which dissolves, so as to enable removal of, either the exposed or non-exposed segments of the resist material, depending upon the type of resist employed, e.g., a positive or a negative resist, and the type of develop process employed, e.g., positive tone develop or negative tone develop. If the resist material is a positive resist and a positive tone develop process is used, the exposed portions are dissolvable and therefore removable by the developer. If the resist material is a positive resist and a negative tone develop process is used, the non-exposed portions are dissolvable and therefore removable by the developer. If the resist material is a negative resist, the non-exposed portions are selectively dissolvable and therefore removable by the developer. The resist material remaining after development protects still-covered regions of the base material from effects of subsequent etch or implant operations.

Such photolithographic processes may be used to pattern materials with particularly small dimensions, e.g., with lines thinner than 250 nanometers in width. In such small-dimensioned lithographic processes, capillary forces attributable to the composition and reaction of a resist material during development of the resist may be greater than adhesive interactions between the resist and the underlying material with which the resist is in contact. Line collapse, toppling, or both may occur, causing distortion of the shape of the remaining segments of the resist material, i.e., the non-developed resist material. With decreasing critical dimensions in line-space patterns, line collapse is becoming a recurring problem, for example in the case of 193 nm photolithography.

DETAILED DESCRIPTION

Figure 1:
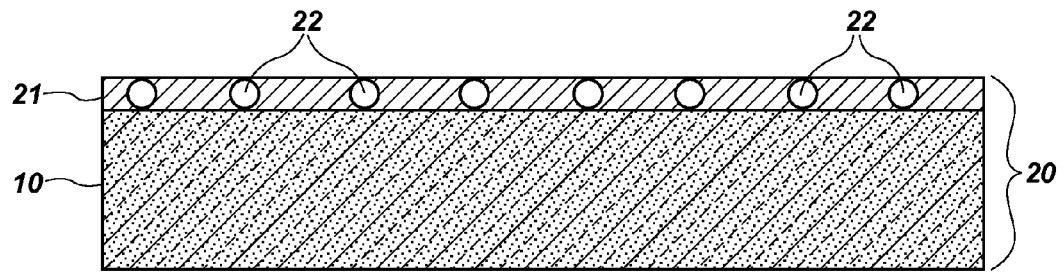
FIGS. 1 through 5 are cross-sectional, elevation, schematic illustrations of components of a semiconductor device during various stages of processing according to an embodiment of the present disclosure.

Methods for adhering materials, for enhancing adhesion between materials, and for patterning a stack of materials are disclosed. Also disclosed are related semiconductor device structures. The methods include bonding a polymer material to an underlying base material so as to form a grafted polymer material on the underlying base material. The underlying base material may be a substrate, a primer material supported by the substrate, a hardmask material, or another base material to be patterned. A resist material, with which the grafted polymer material is at least partially miscible, is applied over the grafted polymer material. The resist material at least partially dissolves within the grafted polymer material, enhancing the resulting adhesion between the resist material and the underlying base material. During development and subsequent patterning of the resist material, the resist material, adhered to the base material via the grafted polymer material, may exhibit increased stability and a lower likelihood of suffering from line collapse or toppling, even at small line dimensions, e.g., sub-50 nanometers.

As used herein, the term "substrate" means and includes an exposed material or construction upon which materials, such as resist materials, may be deposited or otherwise formed. The substrate may be a semiconductor substrate, a base semiconductor on a supporting structure, a metal electrode, or a semiconductor substrate having one or more layers, structures, or regions formed thereon. While materials described and illustrated herein may be formed as layers, the materials are not limited thereto and may be formed in other three-dimensional configurations. The substrate may be a silicon substrate or other bulk substrate including a semiconductive material. As used herein, the term "bulk substrate" means and includes silicon wafers, silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$, where x may be, for example, a mole fraction between 0.2 and 0.8), germanium (Ge), gallium arsenide (GaAs), gallium nitride (GaN), or indium phosphide (InP). Furthermore, when reference is made to a "substrate" in the following description, previous process stages may have been conducted to form regions or junctions in the base semiconductor structure or foundation.

As used herein, the term "polymer brush" means and includes a polymer macromolecule including at least one "backbone" formed of monomers to which is bonded at least one reactive group bondable with the underlying material.

As used herein, the term "developable" means a material formulated to be selectively dissolved or otherwise removed by an appropriate developer following exposure to an appropriate energy source, or a chemical composition formulated to alter miscibility of the developable material with the developer. Therefore, as used herein, a material referred to as "developable" may be selectively soluble within an appropriate developer either in a present state or only following exposure to an appropriate energy source or a chemical composition. For example, a positive resist is "developable" in that, following exposure to an appropriate wavelength of radiation or an appropriate chemical composition, the exposed segments of the positive resist may be removed by an appropriate developer material in which only the exposed segments of the positive resist are soluble. As another example, a negative resist is "developable" in that, unless exposed to appropriate radiation or an appropriate chemical composition, non-exposed segments of the negative resist material are soluble or otherwise removable by an appropriate developer material. As still another example, a polymer material miscible in a developer, without regard to whether the material has been or will be exposed to an energy source, etc., is also "developable" as the term is used herein.

As used herein, the terms "intertwine," "intertwining," and "intertwined" refer to materials having portions that at least partially overlap one another, are at least partially overlapping one another, or are at least partially overlapped by one another, respectively, along at least two sides or faces of the materials or the molecules thereof. For example, "intertwined" materials include materials that are situated relative to one another such that shifting one material in any one direction brings at least a part of that material into closer contact with part of another material.

As used herein, the terms "first," "second," "third," etc., may describe various elements, components, regions, materials, and/or sections, none of which are limited by these terms. These terms are used only to distinguish one element, component, region, material, or section from another element, component, region, material, or section.

As used herein, spatially relative terms, such as "beneath," "below," "lower," "bottom," "above," "upper," "top," "front," "rear," "left," "right," etc., may be used for ease of description to describe one element or feature's relationship to another element(s) or feature(s) as illustrated in the figures. Unless otherwise specified, the spatially relative terms are intended to encompass different orientations of the element(s) or feature(s) in fabrication, use, or operation in addition to the orientation depicted in the figures. For example, if an element in the figures is turned over, elements described as "below" or "beneath" or "under" or "on bottom of" other elements would then be oriented "above" or "on top of" the other elements. Thus, the term "below" can encompass both an orientation of above and below, depending on the context in which the term is used, which will be evident to one of ordinary skill in the art. The element(s) or feature(s) may be otherwise oriented (rotated 90 degrees or at other orientations) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, the term "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, molecule, component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but include deviations in shapes that result, for example, from manufacturing. For example, a region illustrated or described as box shaped may, typically, have rough and/or nonlinear features. Moreover, sharp angles that are illustrated may be rounded. Thus, the regions illustrated in the figures are schematic in nature. Their shapes are not intended to illustrate the precise shape of a region, and they do not limit the scope of the present claims.

Embodiments are described herein also with reference to illustrations of atoms, molecules, macromolecules, elements, or compounds, which illustrations are merely schematic. Unless the context indicates otherwise, embodiments are not limited to any particular atomic or molecular orientation, size, or shape.

The following description provides specific details, such as material types and processing conditions, in order to provide a thorough description of embodiments of the disclosed methods and structures. However, a person of ordinary skill in the art will understand that the embodiments of the methods and structures may be practiced without employing these specific details. Indeed, the embodiments of the methods and structures may be practiced in conjunction with conventional IC fabrication techniques employed in the industry.

The processes described herein do not form a complete process flow for fabricating semiconductor device structures. The remainder of the process flow is known to those of ordinary skill in the art. Accordingly, only the methods and semiconductor device structures necessary to understand embodiments of the present methods and structures are described herein.

Unless the context indicates otherwise, the materials described herein may be formed by any suitable technique including, but not limited to, spin coating, knife coating, dip coating, blanket coating, chemical vapor deposition ("CVD"), atomic layer deposition ("ALD"), plasma enhanced ALD, and physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, and other methods.

Reference will now be made to the drawings, where like numerals refer to like components throughout. The drawings are not necessarily drawn to scale.

A method for adhering a resist material to another, underlying material, which may also be characterized as a base material, is disclosed. The method includes grafting (i.e., bonding) a polymer brush material to the base material and applying a resist material over the grafted polymer brush material to form an intertwined material. The intertwining of the grafted polymer brush material and the resist material enhances adhesion between the resist material and the base material to which the polymer brush is grafted. The intertwining further enhances strength and stability to the resist material. The increased strength may decrease the likelihood of line collapse or toppling during subsequent development and removal of select segments of the resist material during patterning of the base material. The enhanced adhesion between the resist material and the base material may further enable patterning of smaller feature sizes without experiencing unwanted line collapse, or toppling.

FIGS. 1 through 5 illustrate stages in methods for enhancing adhesion between materials, such as between a resist material and a base, underlying material. The base material is formed from a material with which a polymer brush material may form covalent bonds. With reference to FIG. 1, a base material 20 has functional groups 22 with which functional groups on the polymer brush material may react. The base material 20 may include more than one material, such as a substrate 10 carrying a material 21 of the same or different composition. The carried material 21 may include, for example and without limitation, a hardmask material, a coating material, a silicon-including material, or a silicon-oxide-including material. The carried material 21 may be a dielectric antireflective coating (DARC) or a spin-on material including, but not limited to, silicon, polysilicon, silicon dioxide, silicon oxynitride, or combinations thereof. The base material 20 may also include multiple materials in a mixture, in layers, or in adjacent sections, and may further include a substrate 10 with one or more carried materials 21 on only portions thereof. For example, the base material 20 may include a nonreactive material, such as amorphous carbon (AC) or transparent carbon (TC), upon which a silicon, polysilicon, silicon dioxide, or silicon oxynitride material is formed. In one embodiment, the base material 20 includes a carbon (e.g., amorphous carbon, transparent carbon (TC)) with silicon oxynitride thereabove.

Figure 2:
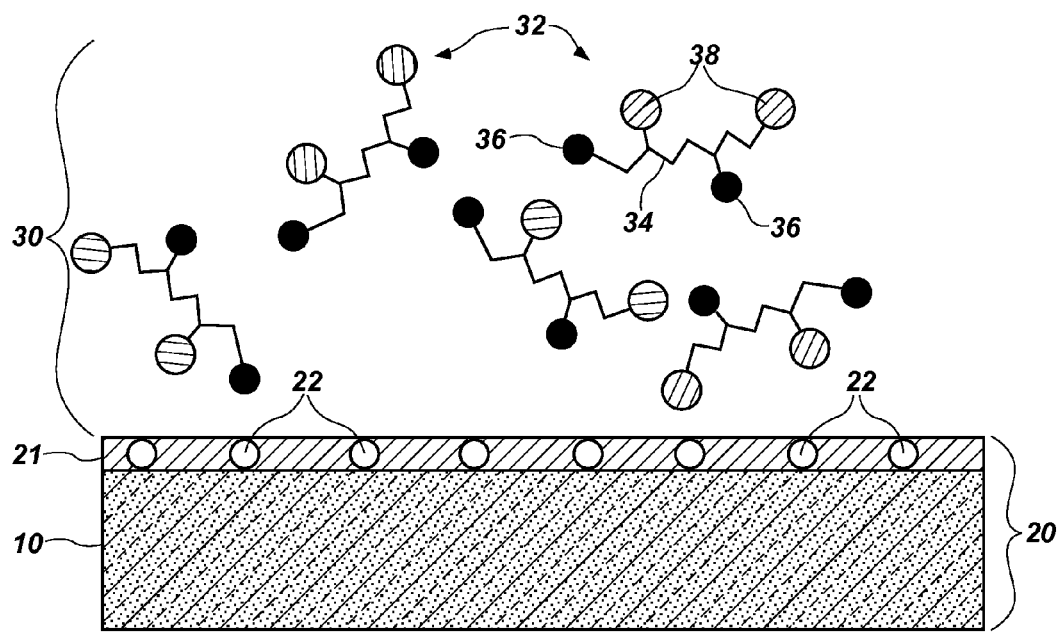

With reference to FIG. 2, a polymer brush material 30 is deposited over the base material 20. In some embodiments, the polymer brush material 30 is deposited on an already-patterned base material. In other embodiments, the polymer brush material 30 is deposited on a non-patterned base material 20. The polymer brush material 30 may be deposited by spin coating, knife coating, dip coating, or another technique conventionally used to deposit a photoresist material over a substrate. The polymer brush material 30 may be deposited so as to achieve a substantially uniform coating over the base material 20.

The polymer brush material 30 may include macromolecular polymer brushes 32. The polymer brush material 30 may further include quenchers, surfactants, or other materials within compositions of conventional resist materials. Each polymer brush 32 includes a plurality monomers, referred to herein as "brush monomers." The brush monomers of a polymer brush 32 may foam a backbone 34 of the macromolecule. The polymer brush material 30 may include, for example and without limitation, polymer brushes 32 in the form of polyacrylates, polymethacrylates, polystyrenes, or mixtures thereof. The brush monomers forming the backbone 34 of the polymer brushes 32 may include, for example and without limitation, acrylate monomers, methacrylate monomers, styrenic monomers, hydroxyethylmethacrylate monomers, epoxydicyclopentadiene methacrylate monomers, or other known monomers of conventional photoresist materials. The monomers forming the backbones 34 of the polymer brushes 32 may, more particularly, be monomers of polymers within conventional resist materials, for example resist materials formulated for 193 nanometer lithography or 248 nanometer lithography.

The polymer brushes 32 also include at least one reactive group 36. The reactive group 36 may be bonded to the backbone 34 of the polymer brush 32. The polymer brushes 32 may include more than one reactive group 36. Multiple reactive groups 36 within a polymer brush 32 may be of the same or different chemical composition. The reactive group 36 of the polymer brush 32 may be bondable to the base material 20. The reactive group 36 may include, for example and without limitation, a hydroxyl group, a carboxyl group, an epoxy group, or another group bondable to the base material 20. In one embodiment, the polymer brushes 32 include hydroxyl groups that react, for example, with silicon atoms representing the functional groups 22 in the base material 20. Reaction of the hydroxyl group of the polymer brushes 32 with the silicon atoms in the base material forms silicon ester (Si—O) covalent bonds between the polymer brushes 32 of the polymer brush material 30 and the functional groups 22 of the base material 20.

The polymer brush 32 may further include nonreactive groups 38. As used herein, the term "nonreactive group" refers to a group, bonded to the backbone 34 of the polymer brush 32, formulated not to readily react with functional groups 22 within the base material 20. Nonreactive groups 38 may include, for example and without limitation, an alkyl group, a phenyl group, a furyl group, an adamantly group, a lactone group, or another known group of a polymer macromolecule of a conventional resist material. More than one nonreactive group 38 may be included in the polymer brush 32, and nonreactive groups 38 within the same or separate polymer brush 32 macromolecules may be of the same or different chemical compositions.

Figure 3:
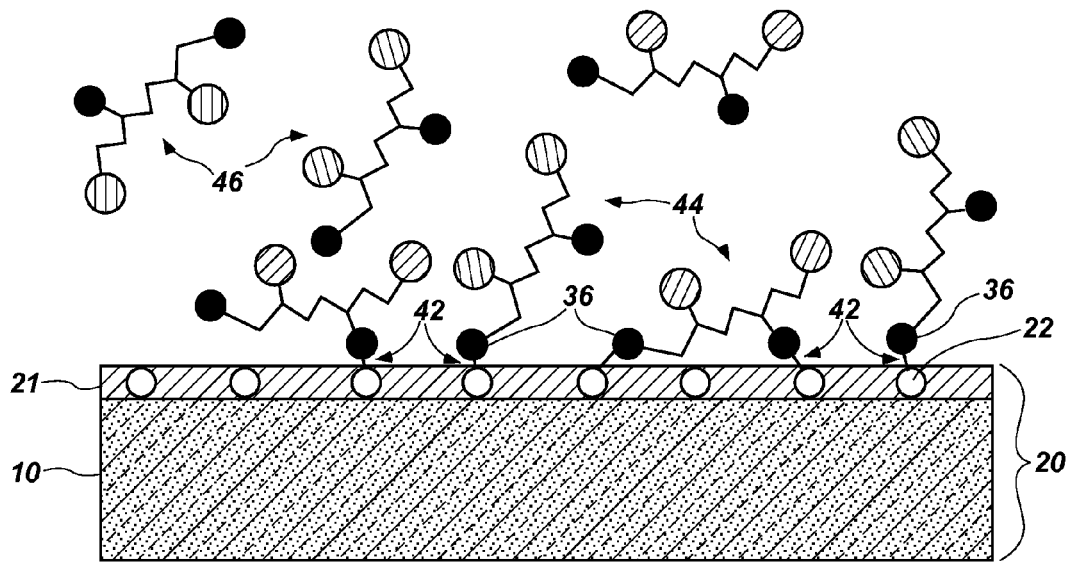

Polymer brushes 32 within the polymer brush material 30 may be grafted (i.e., bonded) to the base material 20 to form grafted polymer brushes 44, as illustrated in FIG. 3. Grafting the polymer brushes 32 to the base material 20 includes bonding at least one reactive group 36 of the polymer brushes 32 to functional groups 22 within the base material 20. For example, in embodiments in which the reactive groups 36 of the polymer brushes 32 include hydroxyl groups and the base material 20 includes silicon, grafting the polymer brushes 32 to the base material 20 may include covalently bonding the reactive group 36 (e.g., the hydroxyl group) to the silicon within the base material 20 to form a bond 42 (e.g., a covalent bond, a covalent silicon-oxygen bond) between the grafted polymer brushes 44 and the base material 20. Because covalent bond forces are from about ten times to about twenty times stronger than polar and van der Waals forces, covalently bonding the polymer brushes 32 to the underlying material 20 may increase the adhesion between the polymer brush material 30 and the base material 20.

More than one reactive group 36 of a single polymer brush 32 may be bonded to the functional groups 22 within the base material 20. Accordingly, grafting the polymer brushes 32 to the base material 20 may include grafting the polymer brushes 32 at more than one location along the backbone 34 of the polymer brush 32. Therefore, a grafted polymer brush material 40 may include grafted polymer brushes 44 bonded to the base material 20 with more than one bond between the grafted polymer brush 44 and the base material 20.

In grafting the polymer brush material 30 to the base material 20, some of the polymer brushes 32 within the polymer brush material 30 may bond to the base material 20. These bonded polymer brushes 32 are referred to herein as the "grafted polymer brushes" 44. Other polymer brushes 32 within the polymer brush material 30 may not bond to the base material 20. These polymer brushes 32 are referred to herein as "nongrafted polymer brushes" 46. The ratio of grafted polymer brushes 44 to nongrafted polymer brushes 46, and also the resulting density of the grafted polymer brushes 44 on the base material 20 may depend upon the amount of polymer brush material 30 deposited on the base material 20; temperature and pressure conditions during grafting; and a number of available reactive sites (e.g., number of functional groups 22) in the base material 20. Subjecting one or more of the polymer brush material 30 and the base material 20 to increased temperatures during grafting may enhance bond formation and increase the ratio of grafted polymer brushes 44 to nongrafted polymer brushes 46. Therefore, grafting the polymer brush material 30 may include exposing the polymer brush material 30, the base material 20, or both to heat to increase the rate of reaction of the reactive groups 36 of the polymer brush 32 with the functional groups 22 of the base material 20. The polymer brush material 30 may be heated to temperatures between 18 degrees Celsius and 350 degrees Celsius. Heating the polymer brush material 30 may include annealing the polymer brush material 30 to plasticize the polymer brush material 30 to flow and react with the functional groups 22 of the base material 20. Heating the polymer brush material 30 may be conducted for about two minutes to facilitate bonding of the reactive groups 36 of the polymer brushes 32 to the functional groups 22 of the base material 20.

The grafted polymer brush material 40 may include a coating of the polymer brush material 30 over the base material 20 and may have a thickness between about five nanometers and about ten nanometers. The grafted polymer brush material 40 may include a saturated or substantially saturated monolayer of the grafted polymer brushes 44.

Figure 4:
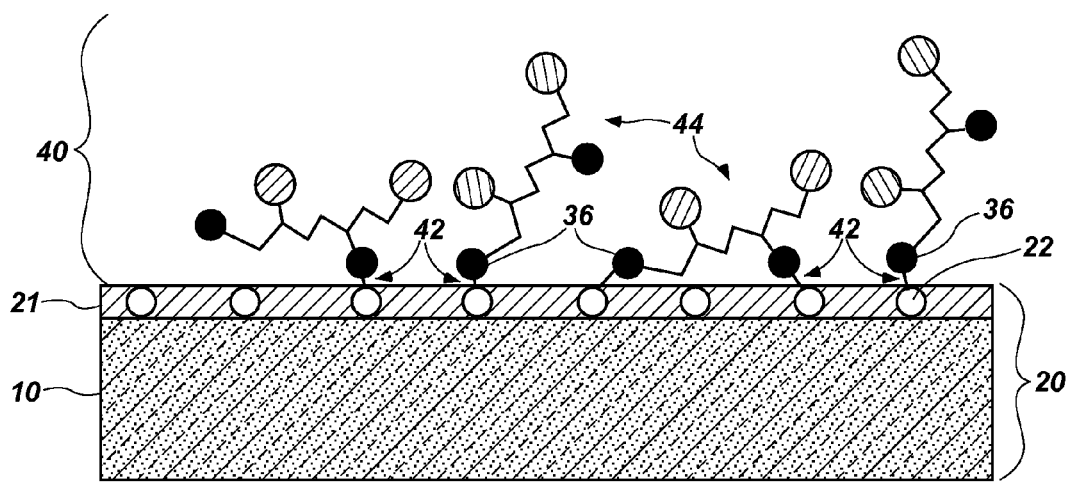

Following grafting, the nongrafted polymer brushes 46 (e.g., unbound polymer brushes) may be removed to leave the grafted polymer brush material 40 formed from the grafted polymer brushes 44, as illustrated in FIG. 4. The nongrafted polymer brushes 46 may be removed from the base material 20 by rinsing the nongrafted polymer brushes 46 from the grafted polymer brush material 40 with a solvent, e.g., a solvent conventionally used when applying a resist material to a surface, or by other conventional techniques.

Neighboring grafted polymer brushes 44 bonded to functional groups 22 within the base material 20 may be bonded in the same or similar orientation or in different orientations, as shown in FIG. 4. Some or all of the grafted polymer brushes 44 may be grafted to the base material 20 by more than one bond 42 between a reactive group 36 of the grafted polymer brush 44 and a functional group 22 within the base material 20.

Figure 5:
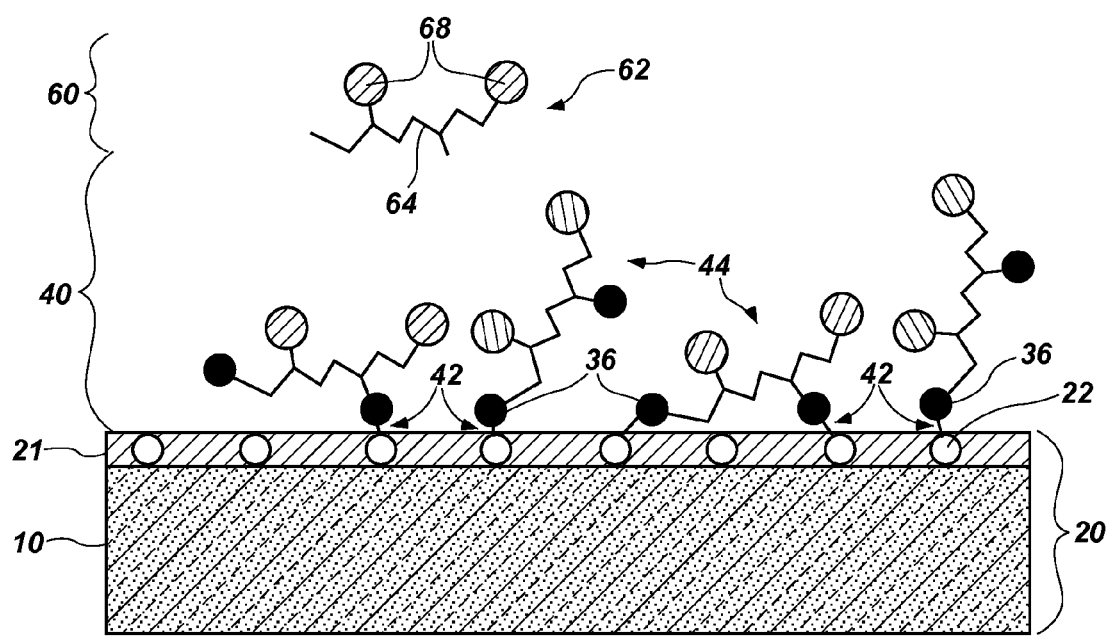

As illustrated in FIG. 5, a resist material 60 is applied on the grafted polymer brush material 40. The resist material 60 may be applied by spin coating, knife coating, dip coating, or other conventional resist-application technique. The resist material 60 may include polymer resist macromolecules 62, which may also be polymer based. (Though FIG. 5 depicts one resist macromolecule 62 for convenience, a plurality of resist macromolecules 62 may be included in the resist material 60.) The resist material 60 may further include quenchers, surfactants, or other materials in conventional resist compositions. In one embodiment, the resist material 60 is a conventional 193 nm resist.

The resist macromolecules 62 of the resist material 60 may include a plurality of polymer monomers, referred to herein as "resist monomers." The resist monomers of the resist macromolecule 62 may form a backbone 64 of the resist macromolecule 62.

The resist macromolecules 62 may be identical or substantially identical in chemical composition to the polymer brushes 32 (FIG. 2) of the polymer material 30 (FIG. 2). Macromolecules and brushes of substantially identical chemical composition may include compounds having cooperative polarities and having at least about 80% of the same elements comprising the molecules. Compounds of substantially identical composition may, alternatively or additionally, include compounds having identical backbones but differing in non-reactive groups attached to the backbones, compounds wherein each bonds to itself in a similar way as the other bonds to itself, compounds with about equal Hansen Solubility Parameters, and compounds for which the relative energy difference (RED) of the molecules is equal to or less than one.

In embodiments in which the resist macromolecules 62 are identical or substantially identical in chemical composition to the polymer brushes 32, the resist monomers of the resist macromolecule 62 may be identical in chemical composition to the brush monomers of the polymer brushes 32. Further in some such embodiments also including polymer brushes 32 with nonreactive groups 38, the resist macromolecules 62 may include identical nonreactive groups 68.

In other embodiments in which the resist macromolecules 62 are substantially identical in chemical composition, the resist macromolecules 62 may be identical in chemical composition to the brush polymers 32, with the exception that the resist macromolecules 62 do not include the reactive groups 36 (FIG. 2) of the brush polymers 32.

The resist macromolecule 62 that are substantially identical to the polymer brushes 32 may exhibit similar or the same polarity and/or wetting properties as the polymer brushes 32. The polymer brush material 30 may be formulated such that the resist material 60 is at least partially miscible in the grafted polymer brush material 40. Therefore, applying the resist material 60 over the grafted polymer brush material 40 may include applying the resist material 60 on the grafted polymer brush material 40 and then allowing at least a portion of the resist material 60 to at least partially dissolve within the grafted polymer brush material 40. Alternatively, applying the resist material 60 over the grafted polymer brush material 40 may include depositing the resist material 60 within, or within and over, the grafted polymer brush material 40. Accordingly, as used in this context, the term "over," in the phrase applying the "resist material 60 over the grafted polymer brush material 40," does not mean or imply that the resist material 60 is applied or otherwise deposited so as to be situated only above the grafted polymer brush material 40. Thus, the resist material 60 may be applied or otherwise deposited above the grafted polymer brush material 40 so that the resist material 60 intermingles with the grafted polymer brush material 40.

The miscibility and polarity of the polymer brushes 32 may be tailored relative to the miscibility and polarity of the resist macromolecules 62. By tailoring the miscibility and polarity of the polymer brushes 32 relative to that of the resist macromolecule 62 to allow dissolution of the resist material 60 at least partially within the grafted polymer brush material 40, the surface area of interaction between the resist macromolecules 62 and the polymer brushes 32 may be increased and enhanced polar interactions between the resist material 60 and the polymer brush material 30 may be achieved. In some embodiments, the resist macromolecules 62 may physically intertwine with the grafted polymer brushes 44, such that the resist material 60 is not chemically bonded to the grafted polymer brush material 40.

The resist material 60 may include a mixture of different resist macromolecules 62. The previously-deposited polymer brush material 30 may be tailored to include a similar mixture of different polymer brushes 32. For example, where the resist material 60 to be used includes a 50/50 mixture of a first resist macromolecule to a second resist macromolecule, the polymer brush material 30 may include a 50/50 mixture of a first polymer brush to a second polymer brush, the first polymer brush being formed of brush monomers of the same or similar chemical composition to the resist monomers forming the first resist macromolecule and with the second polymer brush being formed of brush monomers of the same or similar chemical composition of the resist monomers forming the second resist macromolecule. The distribution of mixtures of resist compounds within the resist material 60 may therefore be the same or similar to a distribution of mixtures of polymer brush compounds within the polymer brush material 30.

The resist material 60 and grafted polymer brush material 40 may be exposed to an energy source (e.g., radiation of a specific wavelength) and developed to form a pattern in the resist material 60 and grafted polymer brush material 40, which pattern is transferrable to the base material 20. The exposure, development, and pattern transfer is conducted by conventional techniques, which are not described in detail herein.

Figure 6:
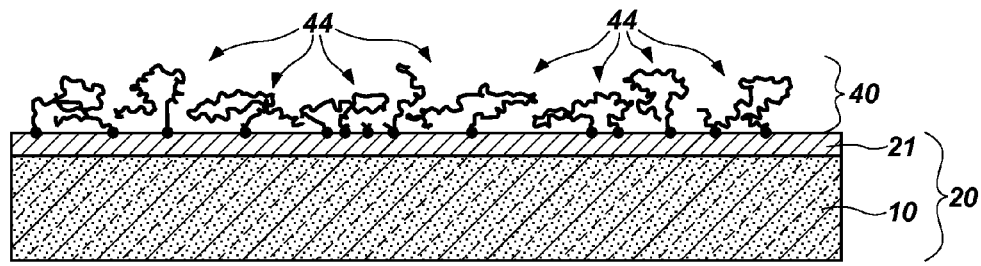
FIGS. 6 through 8 are cross-sectional, elevation, schematic illustrations of components of a semiconductor device during various stages of processing according to an embodiment of the present disclosure.
Figure 7:
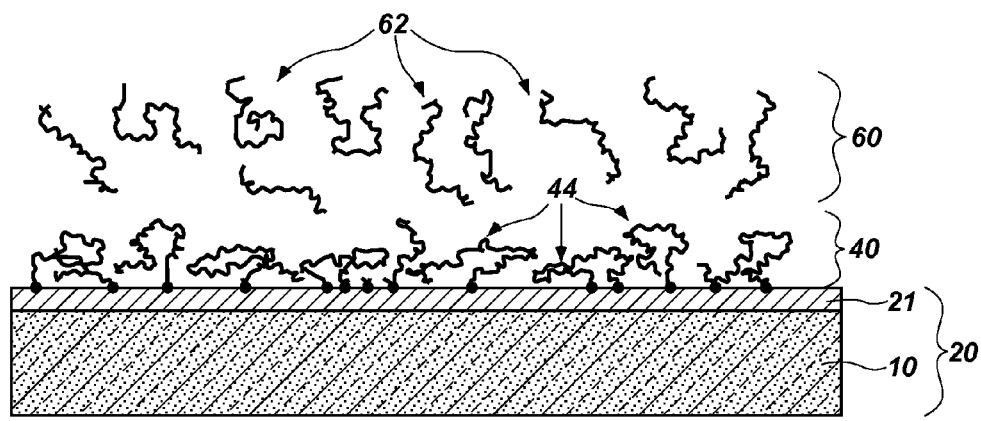
Figure 8:
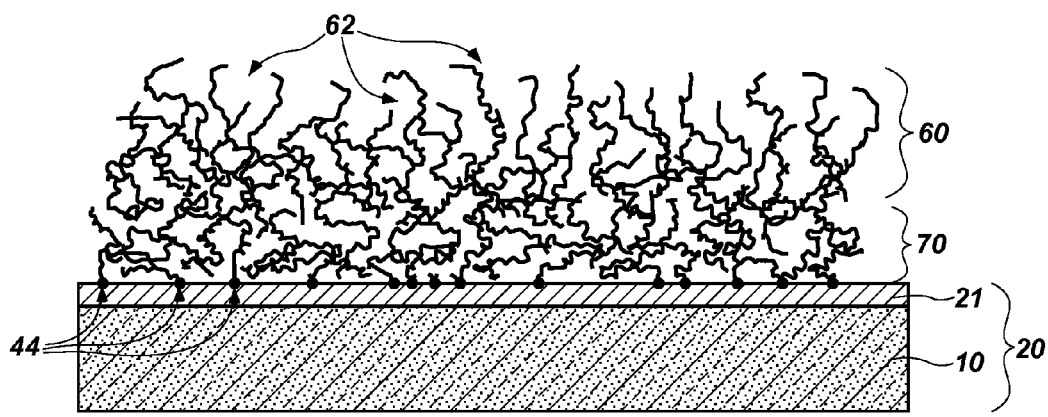

FIGS. 6 through 8 illustrate, from a more distant viewpoint than that of FIGS. 1 through 5, stages of a method for enhancing adhesion between materials. FIG. 6 illustrates the grafted polymer brush material 40 formed on the base material 20, which grafted polymer brush material 40 may be formed as described above. Conditions during the grafting of the polymer brush material 30 (FIG. 2) to the base material 20 may be tailored to form the grafted polymer brush material 40 with a grafted polymer brush 44 density characterized by at least partially overlapping grafted polymer brushes 44. That is, the grafted polymer brushes 44 may not extend substantially vertically from the surface of the base material 20. Rather, the grafted polymer brushes 44 may be more horizontally disposed over the base material 20, and one grafted polymer brush 44 may at least partially laterally overlap another portion of itself or a portion of a neighboring grafted polymer brush 44.

FIG. 7 illustrates the application of resist material 60 over the grafted polymer brush material 40. As illustrated in FIG. 8, application of the resist material 60 over the grafted polymer brush material 40 may form an intertwined material 70 that includes both the grafted polymer brush material 40 (FIG. 7) and resist material 60. The miscibility of the resist material 60 with the grafted polymer brush material 40 allows for formation of the intertwined material 70 by at least partially dissolving the resist material 60 within the grafted polymer brush material 40. The grafted polymer brushes 44 may intertwine with the resist macromolecules 62. Saturation of the grafted polymer brush material 40 with resist material 60 may leave an amount of resist material 60 over the intertwined material 70.

Intertwining the grafted polymer brush material 40 and the resist material 60 provides increased adhesion between the resist material 60 and the base material 20. Because the resist material 60 intertwines with the grafted polymer brush material 40, the surface area available for adhesive interfacing between the resist material 60 and the grafted polymer brush material 40 may be significantly greater than the adhesive interfacing surface area that would be available were the resist material 60 to be deposited directly on the base material 20 (i.e., without the grafted polymer brush material 40 therebetween). For example, the interactive area for adhesive interfacing between the resist material 60 and the grafted polymer brush material 40 may include the area at which each macromolecule polymer brush 32 (FIG. 2) neighbors resist macromolecules 62 (FIG. 5). Therefore, the effective adhesive interfacing area between the resist material 60 and the underlying material to which it is applied is not limited to just the planar surface area of the upper surface of the underlying material.

Figure 9:
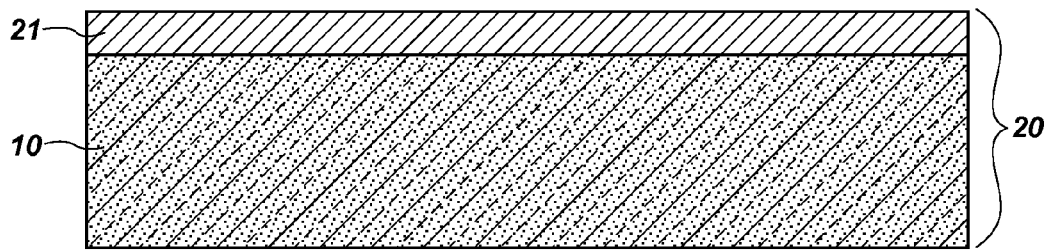
FIGS. 9 through 15 are cross-sectional, elevation, schematic views of components of a semiconductor device during various stages of processing according to an embodiment of the present disclosure.
Figure 10:
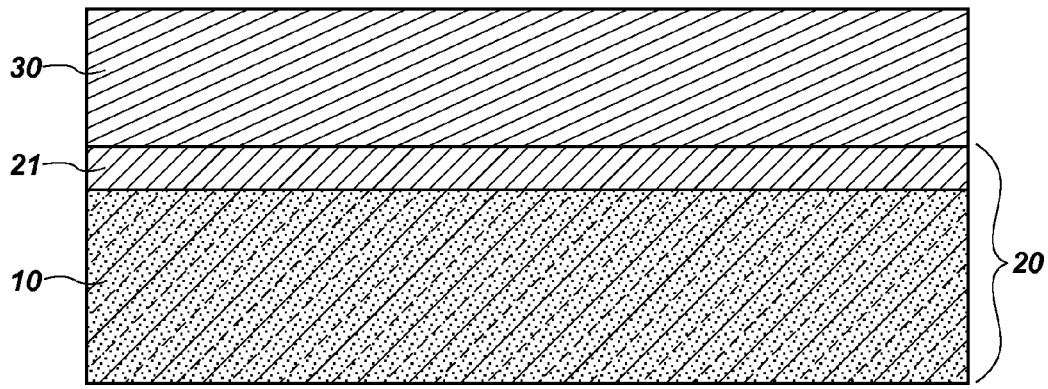
Figure 11:
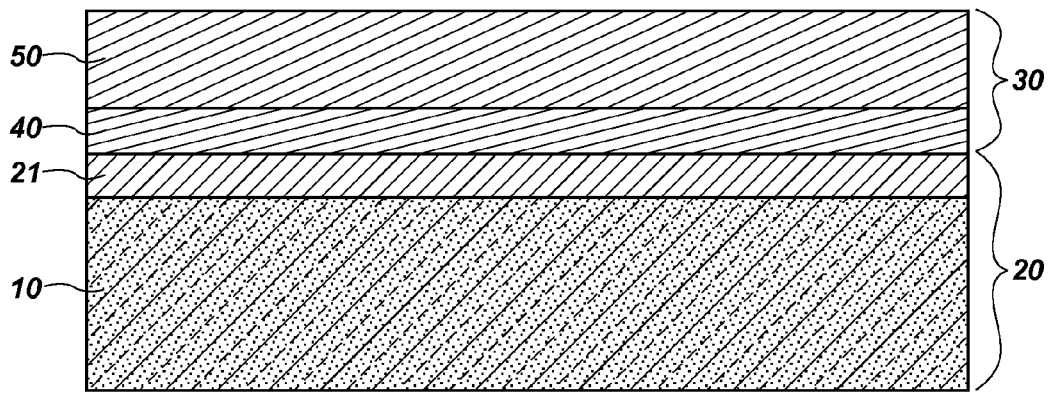
Figure 12:
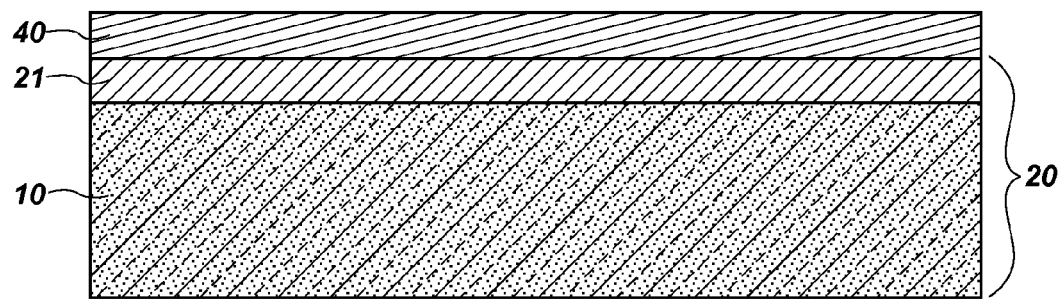

FIGS. 9 through 15 illustrate, from a still more distant viewpoint than that of FIGS. 1 through 5 and FIGS. 6 through 8, stages of a method for enhancing adhesion between materials. FIG. 9 illustrates the base material 20 including the carried material 21 formed over the substrate 10, over which a polymer brush material 30 may be deposited, as illustrated in FIG. 10. At least a portion of the polymer brush material 30 may be grafted to the base material 20 to form the grafted polymer brush material 40, as illustrated in FIG. 11. An amount of nongrafted polymer brush material 50 may remain over the grafted polymer brush material 40. The nongrafted polymer brush material 50 may be removed to leave the grafted polymer brush material 40 over the base material 20, as illustrated in FIG. 12.

Figure 13:
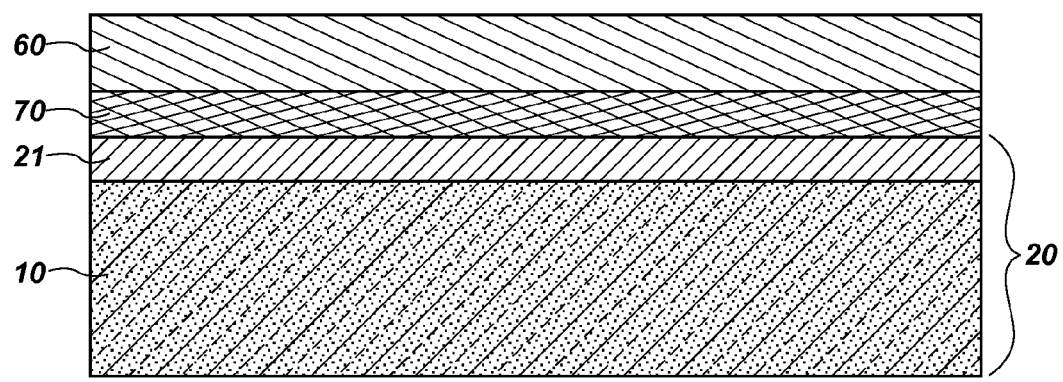

As illustrated in FIG. 13, resist material 60 is applied over the grafted polymer brush material 40 to form the intertwined material 70, over which may remain resist material 60 not intertwined with grafted polymer brush material 40 (FIG. 12). For example, in some embodiments, an excess amount of polymer resist material 60 is deposited over the grafted polymer brush material 40 such that some amount of the polymer resist material 60 infiltrates the grafted polymer brush material 40 to form the intertwined material 70, and the remaining amount of the polymer resist material 60 overlays the intertwined material 70. In other embodiments, application of the resist material 60 does not include application of an excess amount of resist material 60; therefore, following formation of the intertwined material 70, the intertwined material 70 is not overlain by polymer resist material 60.

Figure 14:
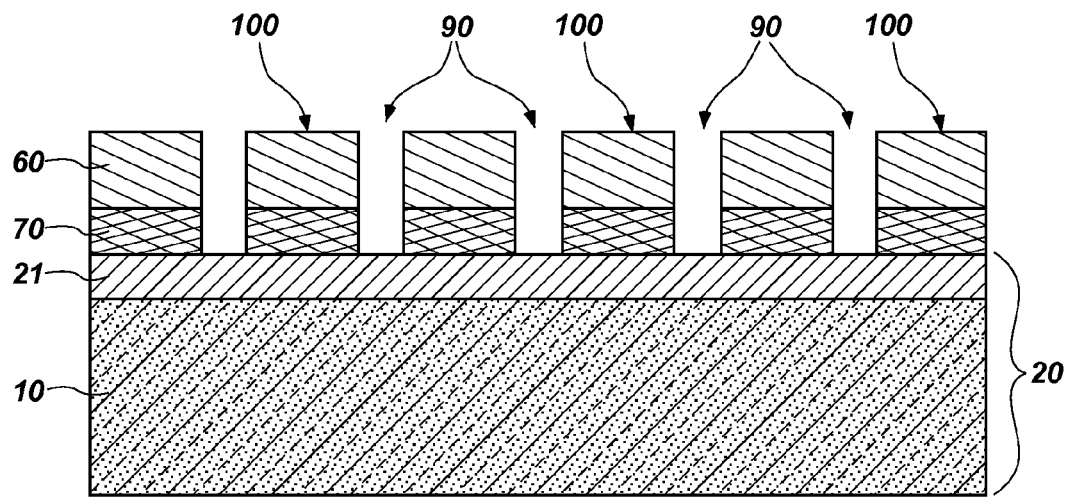

The polymer resist material 60 intertwined with the grafted polymer brush material 40 within the intertwined material 70 forms a mask over the base material 20. As illustrated in FIG. 14, select segments of the intertwined material 70 and, if present, resist material 60 over the intertwined material 70 may be removed to pattern the mask and to expose a pattern of the base material 20. The intertwined material 70 and resist material 60 thereabove may be removed by, for example and without limitation, selectively exposing segments of the intertwined material 70 and resist material 60 to an appropriate energy source or chemical and then dissolving or otherwise disengaging exposed or non-exposed segments of the intertwined material 70 from the surface of the base material 20.

The resist material 60 may be formulated as a positive resist material. Such positive resist material may be developable such that select exposure of segments of the positive resist material to an appropriate energy source or chemical composition makes the positive resist material soluble in an appropriate developer. Thereafter, the exposed segments of the positive resist material may be selectively removed by the developer with respect to non-exposed segments of the positive resist material. An example of a developer of a positive resist material, and therefore also of a similarly-formulated grafted polymer brush material 40, may include, for example and without limitation, an aqueous-based solvent, such as an aqueous solution of tetramethyl ammonium hydroxide (TMAH).

Alternatively, in embodiments in which the resist material 60 is formulated as a positive resist material, the positive resist material may be developable such that, following select exposure of segments of the positive resist material to an appropriate energy source or chemical composition, the non-exposed segments of the positive resist material may be selectively removed by an appropriate developer in a negative tone develop (NTD) process. The appropriate developer in such an NTD process may be an organic solvent, such as n-butyl acetate, in which the non-exposed segments may be selectively removed with respect to the exposed segments of the positive resist material.

In other embodiments, the resist material 60 may be formulated as a negative resist material. Such negative resist material may be developable such that exposure of segments of the negative resist material makes the negative resist material insoluble in an appropriate developer. Therefore, the non-exposed segments of the negative resist material may be selectively removed by the developer with respect to the exposed segments of the negative resist material. An example of a developer of a negative resist material, and therefore also of a similarly-formulated grafted polymer brush material 40, may include, for example and without limitation, TMAH.

In embodiments in which the brush monomers within the grafted polymer brush material 40 within the intertwined material 70 are of the same chemical composition as the resist monomers within the resist material 60 within the intertwined material 70, the grafted polymer brush material 40 within the intertwined material 70 may be formulated to be developable in the same manner that the resist material 60 is developable. Accordingly, to remove select segments of the intertwined material 70 to expose the base material 20, the grafted polymer brush material 40 within the intertwined material 70 and the resist material 60 within the intertwined material 70 may be simultaneously exposed, developed, and removed. That is, exposing the intertwined material 70 to the energy source (e.g., light) or chemical composition may make soluble (e.g., in embodiments in which the resist material 60 is formulated as a positive resist material and the polymer brush material 30 is formulated to be of a similar chemical composition to the resist material 60) or insoluble (e.g., in embodiments in which the resist material 60 is formulated as a negative resist material and the polymer brush material 30 is formulated to be of a similar chemical composition to the resist material 60) in a developer both the resist material 60 within the exposed intertwined material 70 and the grafted polymer brush material 40 within the exposed intertwined material 70. In such embodiments, the developer, the polymer brushes 32, the base material 20, or a combination thereof may be formulated such that the developer cleaves the bond 42 (FIG. 5) between the grafted polymer brush material 40 and the base material 20 during the develop process. Thus, removing select segments of the intertwined material 70 may include removing the grafted polymer brush material 40 within the intertwined material 70 simultaneously with the resist material 60 within and, if any, over the intertwined material 70.

In other embodiments, the grafted polymer brush material 40 and the resist material 60 are not similarly developable. In such embodiments, the brush monomers of the polymer brushes 32 (FIG. 2) may not be of the same chemical composition as the resist monomers of the resist macromolecule 62 (FIG. 5). Removing select segments of the intertwined material 70 may therefore include exposing and developing select segments of the intertwined material 70 to remove the resist material 60 within the intertwined material 70 while leaving at least some of the grafted polymer brush material 40 over the base material 20. Removing such remaining amounts of the grafted polymer brush material (not shown) may include separately developing the remaining grafted polymer brush material with a different, appropriate, developer. Alternatively, removing the remaining amounts of the grafted polymer brush material may include etching the remaining grafted polymer brush material. Etching the remaining grafted polymer brush material may include dry etching the remaining amounts of the grafted polymer brush material.

As further illustrated in FIG. 14, removing the intertwined material 70 exposes the base material 20 such that spaces 90, defined by the removal of the select segments of intertwined material 70, may define a desired pattern to be formed in or on the base material 20. In other embodiments, the non-removed segments of intertwined material 70 may define the desired pattern of the base material 20. In some such embodiments, another material may be applied to at least partially fill the spaces 90 remaining after removal of select segments of the intertwined material 70.

The spaces 90 may also define features 100 (e.g., lines, columns, or other discrete segments of material). The features 100 may have high aspect ratios (i.e., ratios of height to width), e.g., aspect ratios greater than or equal to 4:1. The features 100, which include a segment of intertwined material 70 enhancing adhesion between the resist material 60 and the base material 20, may have enhanced stability compared to feature of the same aspect ratio without a segment of intertwined material between a resist material and a base material. Accordingly, the features 100 may be less likely to experience line collapse than features of the same aspect ratio without intertwined material. In some embodiments, the spaces 90 may also have high aspect ratios of greater than or equal to 4:1.

Figure 15:
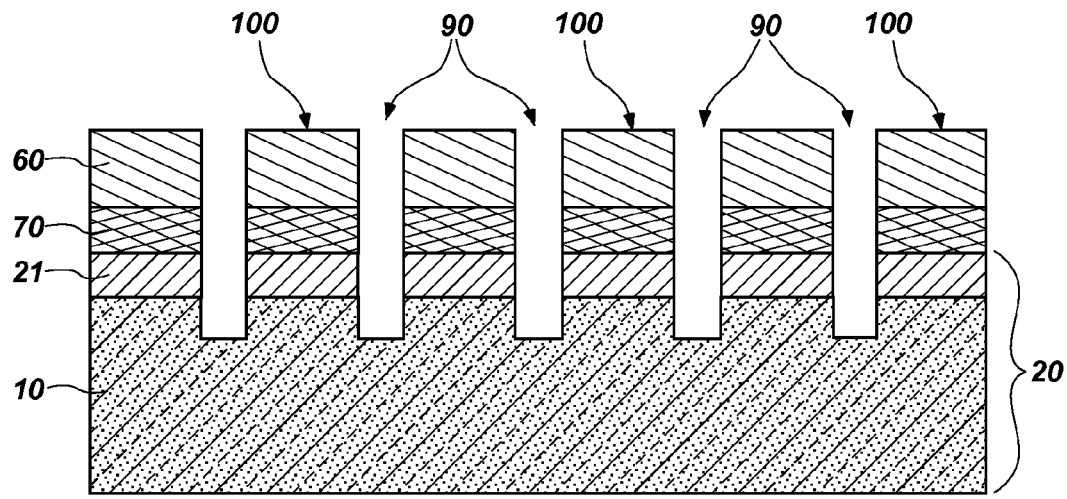

As illustrated in FIG. 15, segments of the base material 20 exposed by the removal of select segments of intertwined material 70 may be removed to transfer the desired pattern to the base material 20. Select segments of the base material 20 removed may include removal of select segments of the carried material 21 or removal of select segments of the carried material 21 and the substrate 10. In embodiments in which amounts of grafted polymer brush material 40 remain following removal of resist material 60 from select segments of the intertwined material 70, the remaining amounts of the grafted polymer brush material (not shown) may be removed simultaneously with the removal of the select segments of base material 20. For example, the remaining amounts of the grafted polymer brush material may be removed by etching, and the etching may be continued to remove underlying segments of the base material 20.

Following patterning of the base material 20, the remaining segments of the intertwined material 70 and any remaining resist material 60 may be removed using conventional techniques, for example and without limitation, by etching, chemical planarization, or physical abrasion.

Accordingly, disclosed is a method for adhering materials, the method comprising bonding a polymer brush material to a base material to form a grafted polymer brush material on the base material. A resist material is applied over the grafted polymer brush material to form an intertwined material comprising the grafted polymer brush material and the resist material. A portion of the intertwined material is removed to expose portions of the base material. Exposed portions of the base material are removed.

The foregoing-described methods may be used to fabricate semiconductor devices and components thereof. For example, the foregoing methods may be used to fabricate memory cells, capacitors, transistors, bit lines, word lines, interconnect lines, and other semiconductor device components. FIGS. 8 and 13 through 15 therefore also illustrate semiconductor device structures.

Accordingly, also disclosed is a semiconductor device structure. The semiconductor device structure may be an intermediate structure or a non-intermediate structure. The semiconductor device structure comprises a base material and a polymer brush material bonded to the base material. Another material is at least partially intertwined with the polymer brush material.

The methods described above, while contemplated to be useful in semiconductor fabrication processes involving photolithography, may also be useful in other processes. That is, at least partially dissolving a material in a polymer brush material grafted to a base material may enhance adhesion between the material and the base material, without regard to whether the material, the base material, or the polymer brush material is to be developed or otherwise patterned. Such adhesion-enhancing methods may be useful in, for example, tailoring a surface of a base material to exhibit a desired wettability. As another example, such adhesion-enhancing methods may be useful in enhancing adhesion between an inorganic base material and an overlying polymer-based material.

Accordingly, also disclosed is a method for enhancing adhesion between a material and another material. A polymer brush material is grafted to a material to form a grafted polymer brush material. Another material is applied over the grafted polymer brush material. The another material comprises another material monomers, and the polymer brush material comprises brush monomers substantially identical in chemical composition to the another material monomers. The another material is at least partially dissolved in the grafted polymer brush material.

Though, in some of the methods described above, forming the intertwined material 70 (FIG. 13) is accomplished in more than one material-application stage (e.g., application of a polymer brush material 30 (FIG. 10) to form the grafted polymer brush material 40 (FIG. 11) and then application of a resist material 60 (FIG. 13) to form the intertwined material 70 (FIG. 13)), in other embodiments, the intertwined material 70 is formed in only one material-application stage. In such embodiments, a developable polymer material (e.g., polymer brush material 30 (FIG. 10)) is deposited over the base material 20 and annealed so as to form an intertwined material 70. The formed intertwined material 70 includes some macromolecules of the developable polymer material that are grafted (i.e., bonded) to the base material 20 as well as some macromolecules of the developable polymer material that are not grafted (i.e., bonded) to the base material 20 but are intertwined with macromolecules that are so grafted. Therefore, with one application of the developable polymer material and subsequent annealing, the intertwined material 70 is formed, rather than with an application and annealing of an amount of polymer material and then application of an additional amount of polymer material to intertwine with the previously-applied-and-annealed amount. In some such embodiments, even though the intertwined material 70 may be formed by a single application of developable polymer material and subsequent anneal, another additional amount of developable polymer material may thereafter be deposited and at least partially dissolved within the previously-applied and grafted developable polymer material.

Accordingly, also disclosed is a method for enhancing adhesion between a base material and a developable polymer material. The developable polymer material is deposited over the base material. At least one of the developable polymer material and the base material is heated. The developable polymer material is bonded to the base material.

Still further, disclosed is a method for patterning a stack (e.g., the stack of intertwined material 70 over the base material 20 (FIG. 13)). A stack is formed. Forming the stack comprises grafting a polymer material (e.g., grafted polymer brush material 40 (FIG. 12)) over a base material (e.g., base material 20) and at least partially dissolving another polymer material (e.g., resist material 60 (FIG. 13)) within the grafted polymer material. Select segments of the stack are removed to expose select segments of the base material. The select segments of the base material correspond to a pattern. The pattern is etched in the base material.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method for adhering materials, the method comprising:
   bonding a polymer brush material to a base material to form a grafted polymer brush material on the base material; and
   applying a developable resist material over the grafted polymer brush material to form an intertwined material comprising the grafted polymer brush material and the developable resist material.

2. The method of claim 1, wherein:
   bonding a polymer brush material to a base material comprises grafting a polymer brush material comprising brush monomers to the base material; and
   applying a developable resist material over the grafted polymer brush material comprises applying a developable resist material comprising resist monomers identical in chemical composition to the brush monomers over the grafted polymer brush material.

3. The method of claim 1, wherein bonding a polymer brush material to a base material comprises bonding a reactive group of the polymer brush material to the base material.

4. The method of claim 3, wherein bonding a reactive group of the polymer brush material to the base material comprises bonding a hydroxyl group of the polymer brush material to the base material.

5. The method of claim 4, wherein bonding a hydroxyl group of the polymer brush material to the base material comprises covalently bonding the hydroxyl group of the polymer brush to a functional group of the base material.

6. The method of claim 1, wherein applying a developable resist material over the grafted polymer brush material comprises at least partially dissolving the developable resist material in the grafted polymer brush material.

7. The method of claim 1, further comprising:
   removing a portion of the intertwined material to expose portions of the base material; and
   removing the exposed portions of the base material.

8. The method of claim 7, wherein:
applying a developable resist material over the grafted polymer brush material comprises applying a positive resist material over the grafted polymer brush material; and
removing a portion of the intertwined material to expose portions of the base material comprises developing the portion of the intertwined material with a developer.

9. The method of claim 7, wherein:
applying a developable resist material over the grafted polymer brush material comprises applying a negative resist material over the grafted polymer brush material to form an intertwined material comprising the grafted polymer brush material intertwined with the negative resist material; and
removing a portion of the intertwined material comprises:
developing the portion of the intertwined material with a developer to remove the developable resist material within the portion of the intertwined material; and
etching the grafted polymer brush material of the portion of the intertwined material.

10. The method of claim 9, wherein etching the grafted polymer brush material of the portion of the intertwined material comprises etching the grafted polymer brush material of the portion of the intertwined material while removing the exposed portions of the base material.

11. The method of claim 1, wherein bonding a polymer brush material to the base material to form a grafted polymer brush material on the base material comprises bonding the polymer brush material to the base material to form a grafted polymer brush material comprising at least partially laterally overlapping grafted polymer brushes.

12. A semiconductor device structure comprising:
a base material supported by a semiconductor substrate;
a polymer brush material bonded to the base material; and
another material at least partially intertwined with the polymer brush material.

13. The semiconductor device structure of claim 12, wherein:
the polymer brush material comprises brush monomers; and
the another material comprises other monomers identical in chemical composition to the brush monomers.

14. The semiconductor device structure of claim 12, wherein the polymer brush material comprises a polymer brush bonded to the base material with more than one bond between the polymer brush and the base material.

15. A method for enhancing adhesion between a material and another material, the method comprising:
grafting a polymer brush material to a material of a semiconductor device structure to form a grafted polymer brush material;
applying another material over the grafted polymer brush material, the another material comprising another material monomers and the polymer brush material comprising brush monomers substantially identical in chemical composition to the another material monomers; and
at least partially dissolving the another material in the grafted polymer brush material.

16. The method of claim 15, wherein grafting a polymer brush material to a material of a semiconductor device structure to form a grafted polymer brush material comprises:
depositing the polymer brush material on the material; and
heating at least one of the material and the polymer brush material to bond reactive groups of the polymer brush material to the material.

17. The method of claim 15, wherein grafting a polymer brush material to a material of a semiconductor device structure comprises grafting the polymer brush material to the material to form a grafted polymer brush material comprising at least partially laterally overlapping polymer brushes.

18. A method for enhancing adhesion between a base material and a polymer brush material, the method comprising:
depositing the polymer brush material over the base material;
annealing at least one of the polymer brush material and the base material to graft a portion of the brush material to the base material and leave another portion of the polymer brush material unbound to the base material; and
after the annealing and before developing at least a part of the portion of the polymer brush material, removing at least some of the another portion of the polymer brush material.

19. The method of claim 18, wherein:
depositing the polymer brush material over the base material comprises depositing the polymer brush material over a base material comprising a carried material on a semiconductor substrate; and
annealing at least one of polymer brush material and the base material comprises bonding the portion of the polymer brush material to the carried material to graft the portion of the polymer brush material to the carried material and leave the another portion of the polymer brush material unbound to the carried material.

20. The method of claim 18:
wherein depositing the polymer brush material over the base material comprises depositing an amount of the polymer brush material over the base material; and
the method further comprising:
adding an additional amount of the polymer brush material on the portion of the polymer brush material rafted to the base material; and
dissolving the additional amount of the polymer brush material at least partially within the portion of the polymer brush material grafted to the base material.

21. The method of claim 20, wherein dissolving the additional amount of the polymer brush material at least partially within the portion of the polymer brush material grafted to the base material comprises dissolving the additional amount of the polymer brush material at least partially within the portion of the polymer brush material grafted to the base material to at least partially intertwine the additional amount of the polymer brush material with the portion of the polymer brush material grafted to the base material.

22. A method for patterning a stack, the method comprising:
forming the stack comprising:
grafting a polymer material to a base material to form a grafted polymer material;
after grafting the polymer material to the base material to form the grafted polymer material, forming another polymer material on the grafted polymer material; and
at least partially dissolving the another polymer material within the grafted polymer material;
after forming the stack, removing select segments of the stack to expose select segments of the base material, the select segments of the base material corresponding to a pattern; and
etching the pattern in the base material.

23. The method of claim 22, wherein removing select segments of the stack comprises simultaneously dissolving in a developer the grafted polymer material and the another polymer material within the select segments of the stack.

24. The method of claim 22, wherein:
   removing select segments of the stack comprises:
   dissolving in a developer the another polymer material within the select segments of the stack; and
   etching the another polymer material within the select segments of the stack.

25. The method of claim 24, wherein etching the another polymer material within the select segments of the stack and etching the pattern in the base material comprise simultaneously etching the another polymer material within the select segments of the stack and etching the pattern in the base material.

* * * * *

UNITED STATES PATENT AND TRADEMARK OFFICE
CERTIFICATE OF CORRECTION

PATENT NO. : 8,728,714 B2  
APPLICATION NO. : 13/298889  
DATED : May 20, 2014  
INVENTOR(S) : Dan B. Millward Page 1 of 1

It is certified that error appears in the above-identified patent and that said Letters Patent is hereby corrected as shown below:

In the Claims

In column 16, line 11, in Claim 18, delete "the" and insert -- the polymer --, therefor.

In column 16, line 24, in Claim 19, delete "of" and insert -- of the --, therefor.

In column 16, line 37, in Claim 20, delete "rafted" and insert -- grafted --, therefor.

Signed and Sealed this  
Nineteenth Day of August, 2014

Michelle K. Lee  
*Deputy Director of the United States Patent and Trademark Office*